United States Patent [19]
Fague

[11] Patent Number: 5,515,364
[45] Date of Patent: May 7, 1996

[54] RADIO FREQUENCY TELECOMMUNICATIONS TRANSCEIVER

[75] Inventor: Daniel E. Fague, Sunnyvale, Calif.

[73] Assignee: National Semiconductor Corporation, Santa Clara, Calif.

[21] Appl. No.: 309,353

[22] Filed: Sep. 20, 1994

Related U.S. Application Data

[62] Division of Ser. No. 29,134, Mar. 10, 1993.

[51] Int. Cl.$^6$ .............................. H04B 1/54; H04B 1/40; H04L 27/04; H04L 27/12
[52] U.S. Cl. .............................. 370/29; 370/30; 375/219; 455/77; 455/83; 455/87; 455/260
[58] Field of Search .................................. 370/29, 24, 30, 370/31, 32, 33, 34, 36, 50, 37, 69.1, 95.1, 121, 95.3, 123, 108; 455/73, 75, 76, 77, 78, 82, 84, 87, 343, 83, 85, 86, 113, 260; 375/219, 220, 221

[56] References Cited

U.S. PATENT DOCUMENTS

| | | | |
|---|---|---|---|
| 4,239,992 | 12/1980 | Perkins | 307/265 |
| 4,449,102 | 5/1984 | Frazer et al. | 327/165 |
| 4,469,082 | 9/1984 | Nishitoba et al. | 123/609 |
| 4,516,083 | 5/1985 | Turney | 331/1 A |
| 4,542,531 | 9/1985 | Fukumura | 455/86 |
| 4,703,520 | 10/1987 | Rozanski et al. | 455/75 |
| 4,761,821 | 8/1988 | Mawhinney et al. | 455/73 |
| 4,873,702 | 10/1989 | Chiu | 375/319 |
| 4,903,257 | 2/1990 | Takeda et al. | 455/86 |

(List continued on next page.)

FOREIGN PATENT DOCUMENTS

| | | |
|---|---|---|
| 0333419 | 3/1989 | European Pat. Off. .......... H04B 1/56 |
| 0333419 | 9/1989 | European Pat. Off. . |
| 0499245A2 | 8/1991 | European Pat. Off. .......... H03L 7/14 |
| 0492433A2 | 7/1992 | European Pat. Off. ........ H03L 7/193 |
| 2523388 | 9/1983 | France . |
| 2535545 | 5/1984 | France . |
| 2188212 | 9/1987 | United Kingdom ............. H04B 1/56 |
| WO81/02653 | 9/1981 | WIPO . |
| WO92/22147 | 12/1992 | WIPO .............................. H04B 1/40 |

OTHER PUBLICATIONS

National Semiconductor Corporation, "Telecommunications Databook", 1992 Edition, pp. 2–98 thru 2–113.

Copy of the Supplemental Information Disclosure Statement with enclosures (Declarations and Exhibits) which was submitted by mail on Sep. 14, 1994, in the parent application (Ser. No. 08/029,134).

Shigeki Saito et al., "State–Preserving Intermittently Locked Loop (SPILL) Frequency Synthesiser for Portable Radio," *IEEE Transactions on Microwave Theory and Techniques*, vol. 37, No. 12 (Dec. 1989), pp. 1898–1903.

*Primary Examiner*—Alpus H. Hsu
*Assistant Examiner*—Ricky Q. Ngo
*Attorney, Agent, or Firm*—Limbach & Limbach

[57] ABSTRACT

A radio frequency (RF) transceiver includes a direct modulation transmitter and single down-conversion receiver for operation in a time-division-duplex (TDD) telecommunications environment. A single RF signal source, in the form of a phase-lock-loop (PLL), is used on a time-shared basis to provide both the carrier signal for the transmitter and the local oscillator (LO) signal for the receiver. In the transmitter, direct modulation is effected by modulating a voltage-controlled oscillator (VCO) in the PLL with a burst of the transmit data while opening the loop and holding the loop feedback tuning voltage constant. In the receiver, a self-adjusting comparator threshold is provided for automatically setting and adjusting a demodulated signal comparison threshold used in retrieving the data and data clock from the demodulated receive signal. The interface between the transmitter and receiver and the host controller provides the control signals needed for the time-sharing of the single RF signal source, the proper programming of the PLL for the different transmitter carrier and receiver LO frequencies, the PLL loop control for the direct modulation of the VCO, and the enablement, or powering down, of the transmitter and receiver sections to minimize transceiver power consumption.

48 Claims, 13 Drawing Sheets

U.S. PATENT DOCUMENTS

| | | | |
|---|---|---|---|
| 5,175,729 | 12/1992 | Borras et al. | 370/79 |
| 5,230,088 | 7/1993 | Kramer, Jr. et al. | 455/76 |
| 5,272,657 | 12/1993 | Basehore et al. | 364/728.03 |
| 5,276,913 | 1/1994 | Lee et al. | 455/76 |
| 5,315,284 | 5/1994 | Bentley et al. | 340/146.2 |
| 5,319,799 | 6/1994 | Morita | 455/78 |
| 5,327,582 | 7/1994 | Wong | 455/76 |
| 5,341,120 | 8/1994 | Nakajima | 340/146.2 |
| 5,351,031 | 9/1994 | Henderson | 340/146.2 |
| 5,363,402 | 11/1994 | Harmon | 455/88 |

RADIO FREQUENCY TELECOMMUNICATIONS TRANSCEIVER

This is a divisional of application Ser. No. 08/029,134, filed Mar. 10, 1993, now pending.

BACKGROUND OF THE INVENTION

1. Field of the Invention

The present invention relates to radio frequency transceivers, and in particular, radio frequency telecommunications transceivers operating in a Time Division Duplex/Time Division Multiple Access ("TDD/TDMA") operating environment.

2. Description of the Related Art

Wireless telecommunications technology has recently become an area in which much development has taken place. As part of this development, much interest has been shown in developing wireless telecommunications transceivers which allow simple, reliable portable communications. In achieving optimal simplicity and reliability, a transceiver must use a minimum of electronic components, as well as the simplest possible transmission and reception techniques. Further, the transceiver should require minimal operator intervention and electrical power. Moreover, all of the foregoing must be provided while at the same time meeting very strict operational standards.

SUMMARY OF THE INVENTION

An RF transceiver in accordance with the present invention includes a transmitter with direct modulation of the transmit carrier signal and a receiver with a single down-conversion of the modulated receive signal to an intermediate frequency (IF) signal for demodulation thereof. In a preferred embodiment of the present invention, the direct modulation transmitter includes a phase-lock-loop (PLL) with a frequency-tunable oscillator which is directly modulated by a transmit data signal.

An RF transceiver in accordance with the present invention further includes a PLL with a frequency-tunable oscillator for providing the transmit carrier signal which is directly modulated by a transmit data signal while remaining substantially phase-locked to a reference signal. In a preferred embodiment of the present invention, the PLL includes a loop switch which is used to open the loop during modulation of the frequency-tunable oscillator.

An RF transceiver in accordance with the present invention further includes a comparator with a self-adjusting threshold signal for comparison with an input signal representing serial data. In a preferred embodiment of the present invention, the threshold signal is adjusted in accordance with the duty cycle of the binary output signal from the comparator.

An RF transceiver in accordance with the present invention still further includes a control interface for operating the transmitter and receiver according to a TDD format, including the generation of the transmitter carrier signal and receiver local oscillator (LO) signal and selective powering down of transmitter and receiver sections during signal reception and transmission, respectively. In accordance with a preferred embodiment of the present invention, a single RF signal generator is used to programmably generate an RF signal which is selectively routed for use as the transmitter carrier signal and as the receiver LO signal.

These and other features and advantages of the present invention will be understood upon consideration of the following detailed description of the invention and the accompanying drawings.

DETAILED DESCRIPTION OF THE INVENTION

Figure 1:
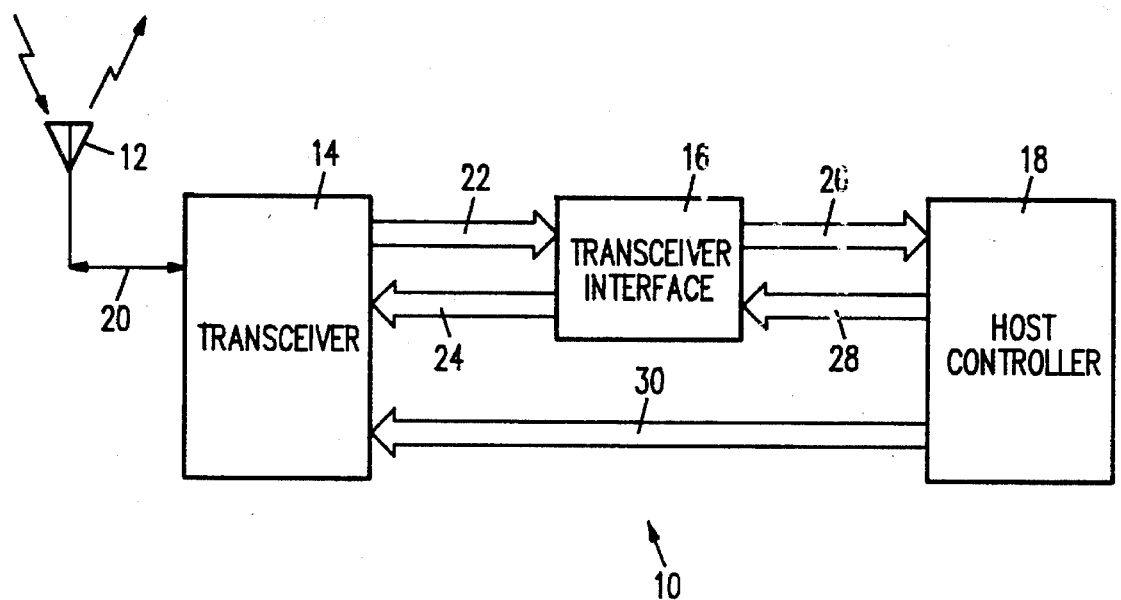
FIG. 1 is a functional block diagram of an RF telecommunications transceiver in accordance with the present invention.

Referring to FIG. 1, an RF telecommunications transceiver 10 in accordance with the present invention includes an antenna 12, transceiver 14, transceiver interface 16 and host controller 18, as shown. Between the antenna 12 and transceiver 14 is an RF signal path 20 which carries, according to a TDD format, the modulated transmit signal from the transceiver 14 to the antenna 12 and the modulated receive signal from the antenna 12 to the transceiver 14. As discussed further below, a number of signals 22, 24 pass between the transceiver 14 and transceiver interface 16 as do a number of signals 26, 28 between the transceiver 16 and host controller 18. Additional signals 30 pass from the host controller 18 to the transceiver 14.

Figure 2:
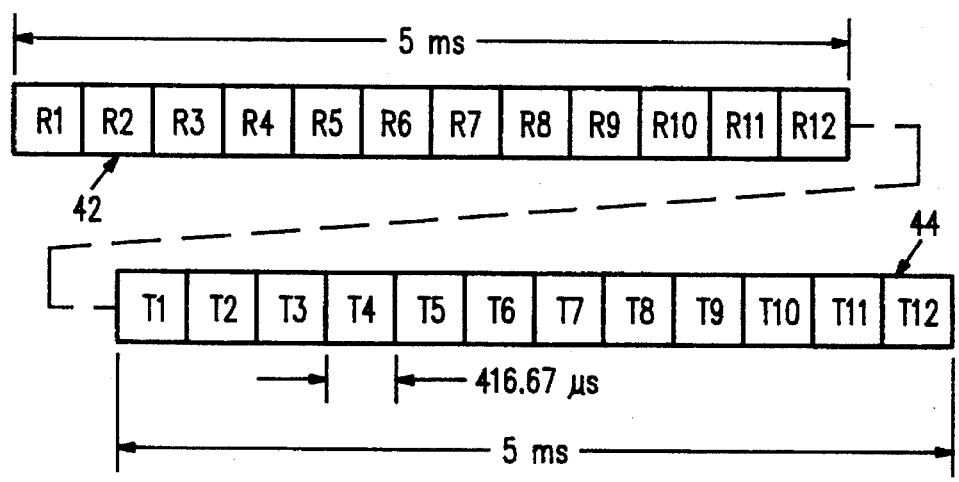
FIG. 2 illustrates an exemplary TDD transmit/receive data frame structure for an RF telecommunications transceiver in accordance with the present invention.

Referring to FIG. 2, an RF telecommunications transceiver 10 in accordance with the present invention operates in a TDD format, thereby allowing a full duplex communication channel to be established. This duplexing technique uses separate time slots on a single carrier signal for transmitting and receiving data signals. The structure of the data frame is as shown. (The particular data frame format shown is the standard for the Digital European Cordless Telecommunications "DECT" system.)

As shown, the complete data frame 40 is ten milliseconds (10 msec) in duration, with a five millisecond (5 msec) receive subframe 42 and five millisecond (5 msec) transmit subframe 44. Each subframe 42, 44 is divided into 12 time slots of 480 bit times in duration, i.e. 416.67 microseconds (μsec) each. When a communication link is made, a receive and transmit time slot are assigned to the users (normally with the same time slot number (e.g. R3 and T3) used for both receive and transmit). Multiple users are thereby accommodated by assigning different time slots to the different users.

As should be evident from the foregoing, an advantage of this TDD transmit and receive scheme is that a telephone conversation requires only one physical frequency channel. A further advantage is that portions of the transceiver need only be powered on for small periods of time, thereby resulting in low power consumption. For example, the transmitter can be turned off while receiving data, and the receiver can be turned off while transmitting data.

Figure 3:
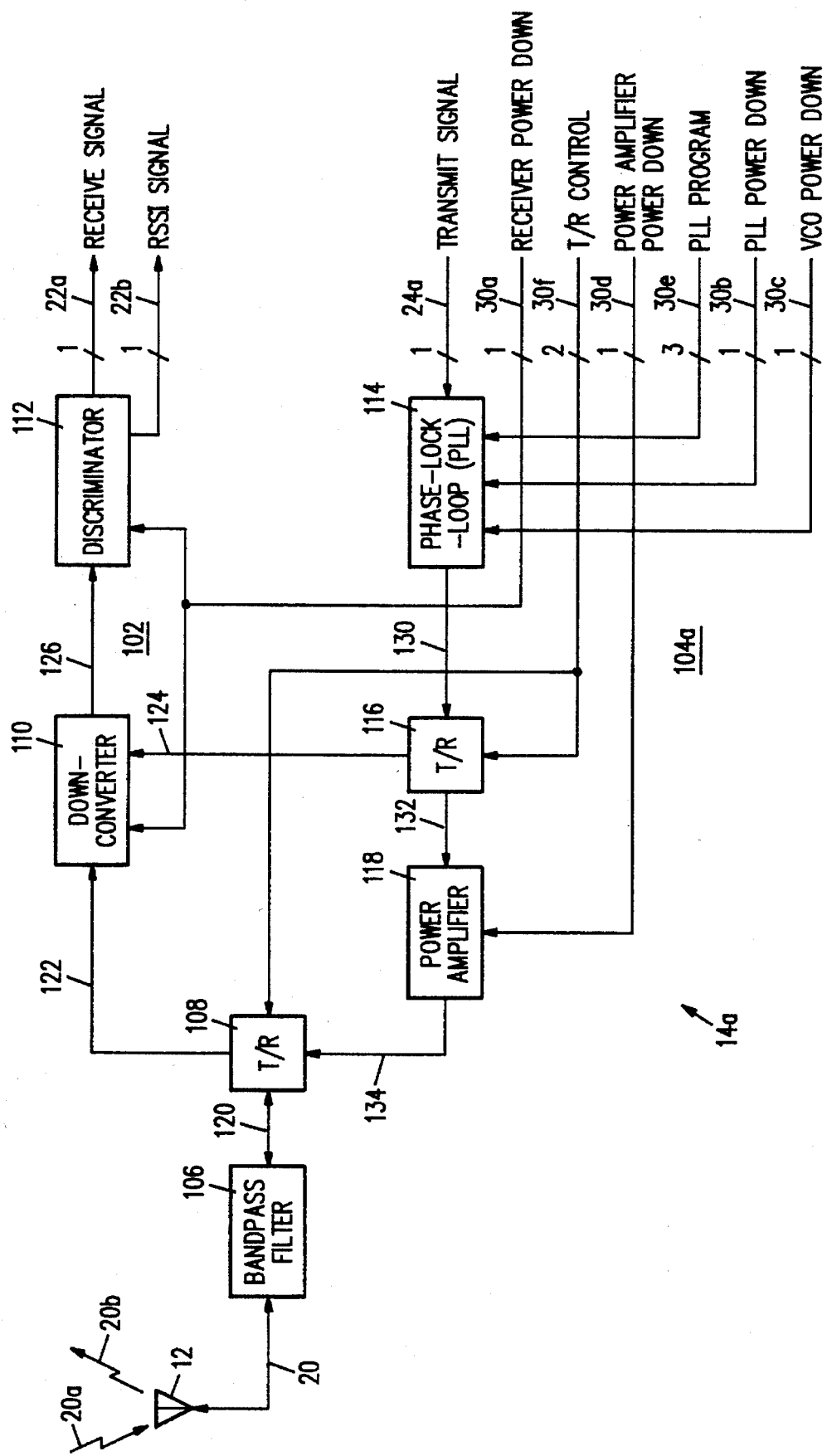
FIG. 3 is a block diagram of a transceiver in accordance with the present invention.

Referring to FIG. 3, a preferred embodiment of a transceiver 14a in accordance with the present invention includes a receiver 102, transmitter 104a, a bandpass filter 106 and antenna signal router 108, as shown. The receiver 102 includes a down-converter 110 and discriminator 112. The transmitter 104a includes a phase-lock-loop (PLL) 114, transmit signal router 116 and power amplifier 118.

During signal reception, a modulated receive signal 20a is received via the antenna 12, filtered by the bandpass filter 106 and conveyed to the antenna signal router 108. In accordance with a T/R control signal 30f, the antenna signal router 108 passes the filtered, modulated receive signal 122 to the down-converter 110. The down-converter 110, in accordance with an enablement signal 30a, uses a local oscillator (LO) signal 124 to perform a single down-conversion. The down-converted signal 126 is passed to the discriminator 112, where it is discriminated, or frequency-demodulated, to produce a demodulated receive signal 22a representing the original serial data. As discussed further below, also produced is a DC receive signal strength indicator ("RSSI") signal 22b, which indicates the signal strength of the received signal.

The receiver 102, i.e. the down-converter 110 and discriminator 112, receives a receiver power down signal 30a which acts as a form of an enablement signal. When this signal 30a is "false," the receiver 102 is enabled, i.e. powered up, and when this signal 30a is "true," the receiver 102 is disabled, i.e. powered down, to minimize DC power consumption.

Similarly, the transmitter 104a receives similar power down, or enablement, signals 30b, 30c, 30d. The PLL 114 receives a PLL power down signal 30b for powering down the active PLL components other than the oscillator. The PLL 114 also receives a VCO power down signal 30c for disabling and enabling the voltage-controlled oscillator. The power amplifier 118 receives a power amplifier power down signal 30d for selectively enabling and disabling the power amplifier 118. This last signal 30d is preferably shaped in such a manner to be other than a square wave, e.g. as a trapezoidally-shaped signal to reduce spurious output signals from the power amplifier 118.

The transmitter 104a has a PLL 114 which produces an RF transmit signal 130 which is selectively routed by the transmit signal router 116 in accordance with its T/R control signal 30f. When the transceiver 14a is operating in the transmit mode, the transmit signal router 116 sends the RF signal 132 to the power amplifier 118. The amplified transmit signal 134 is sent to the antenna signal router 108 which, in accordance with its T/R control signal 30f, sends it on to be filtered by the filter 106 and transmitted via the antenna 12. When the transceiver 14a is operating in the receive mode, the RF signal 130 from the PLL 114 is routed by the transmit signal router 116 to the down-converter 110 in the receiver 102 as the receiver LO signal 124.

During signal transmission, the PLL 114 receives a transmit signal 24a from the transceiver interface 16 (discussed further below). This transmit signal 24a is used to directly modulate the RF transmit carrier produced by a VCO within the PLL 114 (discussed further below). The modulated signal 130 is then initially routed (by the transmit signal router 116), amplified (by the power amplifier 118), routed again (by the antenna signal router 108), filtered (by the filter 106) and transmitted (via the antenna 12).

The PLL 114 also receives a PLL program signal 30e which is used to selectively program a frequency divider within the PLL 114 (discussed further below). This causes its output signal 130 to selectively vary in frequency, depending upon whether it is to be used as the transmit carrier signal 132 or as the receiver LO signal 124.

Figure 4A:
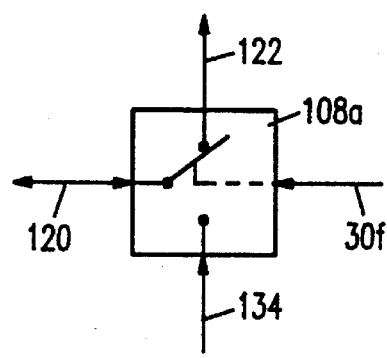
FIGS. 4A, 4B and 4C illustrate various signal routers which can be used in the transceiver of FIG. 3.

Referring to FIG. 4A, the antenna signal router 108 can be realized using an RF switch 108a (e.g. a PIN diode switch). In accordance with the T/R (switch) control signal 30f, incoming signals arriving via the RF transmission line 120 can be switched out as the receive signal 122 to the down-converter 110, or outgoing signals 134 can be switched out to the RF transmission line 120.

Figure 4B:
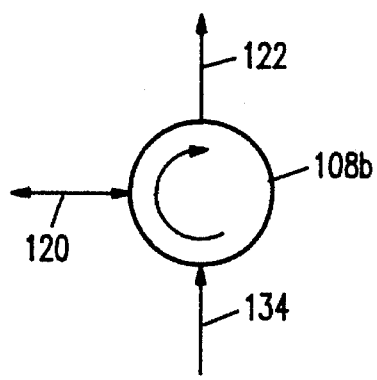

Referring to FIG. 4B, the antenna signal router 108 can alternatively be realized with a circulator 108b. An advantage of a circulator 108b is that no control signal 30f is necessary. Incoming signals on the RF transmission line 120 will be circulated electromagnetically within the circulator 108b to be outputted as the receive signal 122. Similarly, outgoing signals 134 will be circulated electromagnetically to be outputted on the RF transmission line 120.

Figure 4C:
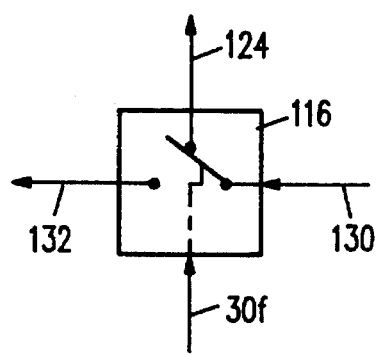

Referring to FIG. 4C, the transmit signal router 116 can be realized with an RF switch (e.g. a PIN diode switch). In accordance with the T/R (switch) control signal 30f, the input RF signal 130 is switched out as the transmit signal 132 to the power amplifier 118, or switched out to the down-converter 110 as the receiver LO signal 124.

Figure 5:
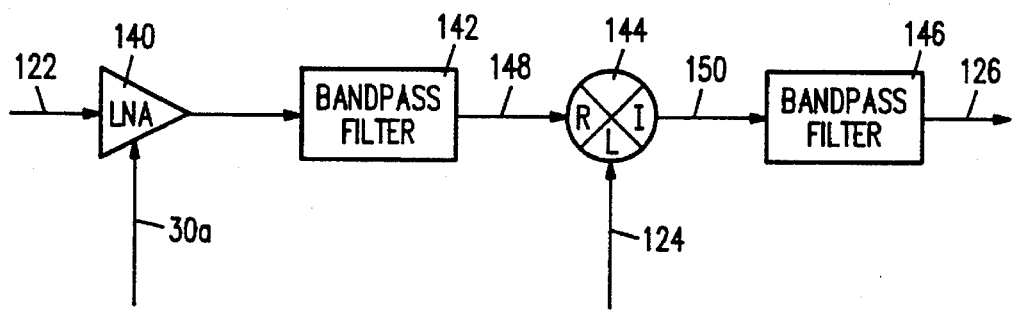
FIG. 5 is a block diagram of the down-converter of the transceiver of FIG. 3.

Referring to FIG. 5, the down-converter 110 includes a low-noise amplifier (LNA) 140, RF bandpass filter 142, mixer 144 and IF bandpass filter 146, as shown. The modulated receive signal 122 is amplified by the LNA 140 and filtered by the RF bandpass filter 142. The amplified, filtered signal 148 is down-converted in the mixer 144 by being mixed with the receiver LO signal 124. This produces an intermediate IF signal 150 which is filtered by the IF bandpass filter 146 to produce the IF signal 126 sent to the discriminator 112.

Figure 6:
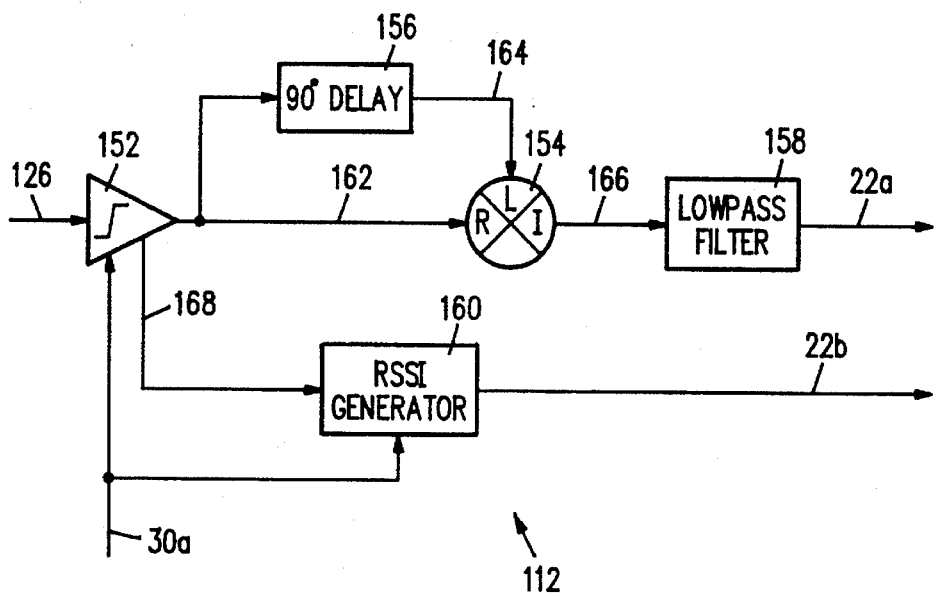
FIG. 6 is a block diagram of the discriminator of the transceiver of FIG. 3.

Referring to FIG. 6, the discriminator 112 includes a limiting amplifier 152, mixer 154, ninety degree (90°) delay element 156, lowpass filter 158 and RSSI generator 160, as shown. This interconnection of the mixer (preferably a Gilbert cell mixer) 154 and 90° delay element 156 (e.g. a quadrature tank circuit) produces a frequency discriminator. The IF signal 126 from the down-converter 110 is inputted to the limiting amplifier 152. The limited output signal 162 is inputted to the RF port of the mixer 154 and to the 90° delay element 156. The delayed signal 164 is inputted to the LO port of the mixer 154. These signals 162, 164 mix and produce a frequency-demodulated signal 166 which is lowpass filtered by the filter 158 to produce the demodulated receive signal 22a. The limiting amplifier 152 also has a DC output signal 168 which is used by the RSSI generator 160 to produce the RSSI signal 22b, which is proportional to the logarithm of the level of the input signal 126 to the limiter 152.

Figure 7:
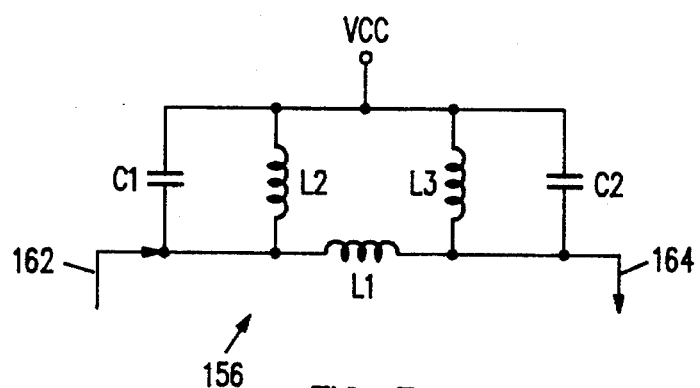
FIG. 7 is a schematic diagram of the delay element of the discriminator of FIG. 6.

Referring to FIG. 7, the 90° delay element 156 can be realized by constructing a quadrature tank circuit, as shown. This circuit 156 introduces a 90° phase shift between the input 162 and output 164 signals at the desired frequency. In accordance with a preferred embodiment of the present invention, wherein the signal frequency is approximately 110.592 Megahertz (MHz), approximate values for the components of the quadrature tank circuit 156 are as shown below in Table 1.

TABLE I (FIG. 7)

| COMPONENT | VALUE |
|---|---|
| L1 | 1.5 microhenry (μH) |
| L2, L3 | 8 nanohenry (nH) |
| C1, C2 | 150 picofarad (pF) |

Figure 8A:
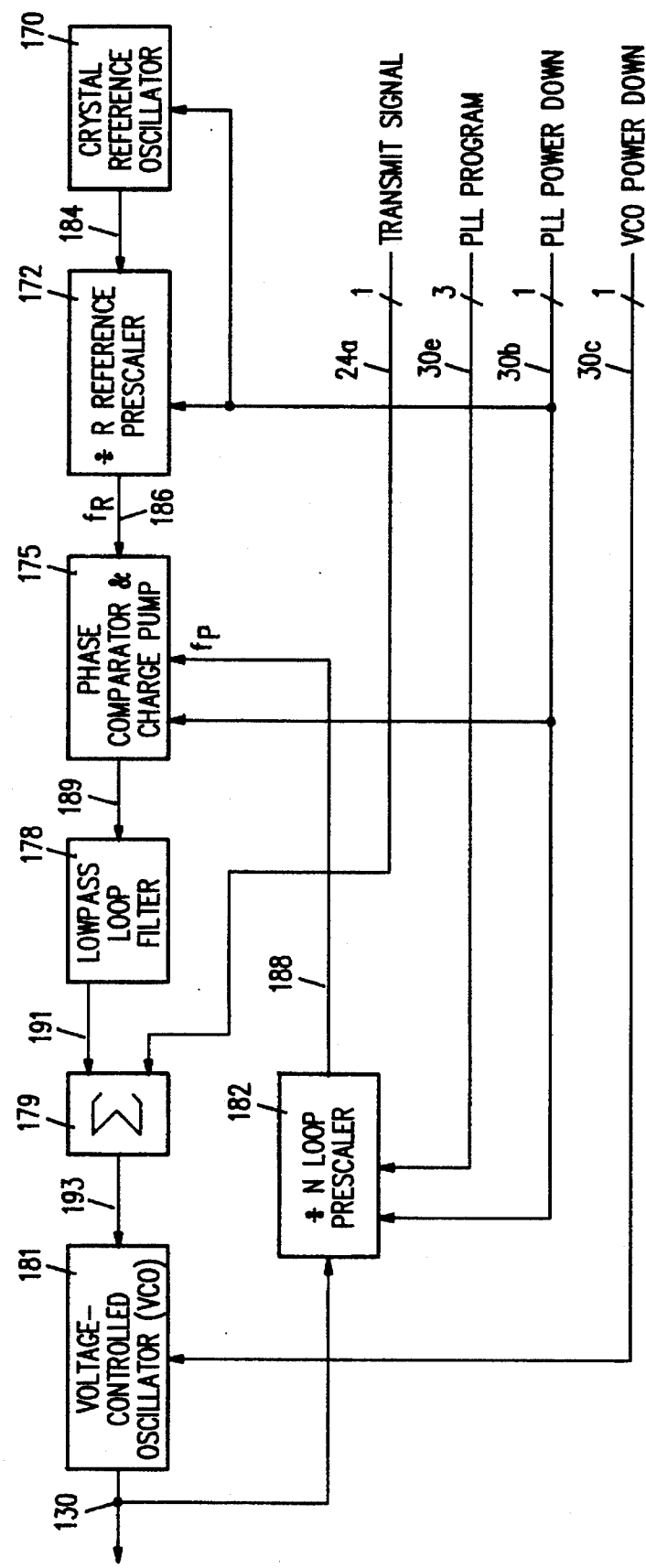
FIG. 8A is a block diagram of the PLL of the transceiver of FIG. 3.

Referring to FIG. 8A, a preferred embodiment of a PLL 114a in accordance with the present invention includes the following elements, as shown: crystal reference oscillator 170; ÷R reference prescaler 172; phase comparator and charge pump 175; lowpass loop filter 178; summer 179; VCO 181; and ÷N loop prescaler 182. The crystal reference oscillator 170 provides a reference signal 184 which is prescaled by the reference prescaler 172. The prescaled reference signal 186 (at frequency $f_R$) is compared with the prescaled output signal 188 (at frequency $f_P$) in the phase comparator and charge pump 175. The resulting output signal 189 (AC when the inputs 186, 188 differ in frequency, DC when inputs 186, 188 are equal in frequency, and approximately zero volts when the inputs 186, 188 are equal in frequency and phase) is inputted to the loop filter 178. The filtered output signal 191 is summed with the transmit signal 24a. The sum signal 193 is used as the control signal (phase-lock and modulation) for the VCO 181. The RF output signal 130 of the VCO 181 is fed back to the loop prescaler 182 to produce the prescaled output signal 188 for the phase comparator and charge pump 175.

During modulation of the PLL 114a, the PLL power down signal 30b turns off the phase comparator and charge pump 175 (as well as the other active elements 170, 172, 182 within the PLL 114a). This causes the phase comparator and charge pump output 189 to remain constant since during this "turned-off" period the output impedance of the phase comparator and charge pump 175 is high (as is the input impedance of the input to the summer 179). This results in virtually no discharging of the shunt capacitance elements within the lowpass loop filter 178, thereby causing the DC carrier tuning voltage at the output 191 of the loop filter 178 to stay virtually constant during the period of direct modulation of the VCO 181 (via the summer 179). Thus, the carrier frequency of the VCO output signal 130 varies little, i.e. it stays substantially frequency- and phase-locked to the prescaled reference signal 186.

A more detailed description of the structure and operation of the phase comparator and charge pump 175 can be found in commonly assigned U.S. patent application Ser. No. 08/003,928, entitled "Charge Pump Circuit" and filed on Jan. 13, 1993, the disclosure of which is incorporated herein by reference.

Figure 8B:
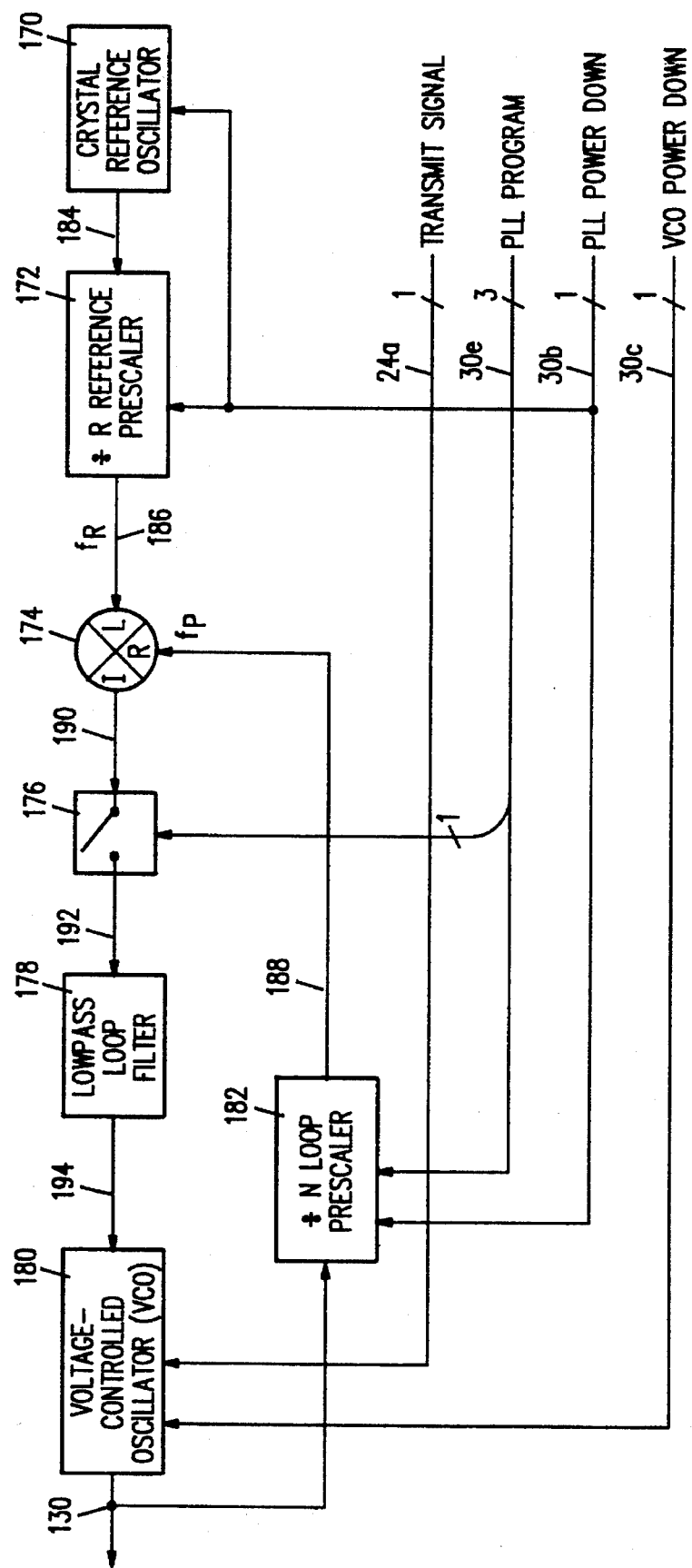
FIG. 8B is a block diagram of an alternative PLL for the transceiver of FIG. 3.

Referring to FIG. 8B, an alternative embodiment of a PLL 114b in accordance with the present invention includes many of the same elements as the embodiment 114a of FIG. 8A, with the following exceptions, as shown: mixer 174; loop switch 176; and dual-tuning input VCO 180. The prescaled reference signal 186 is mixed with the prescaled output signal 188 in the mixer 174 (which is used here as a phase detector rather than as a mixer per se). The resulting output signal 190 (AC when the inputs 186, 188 differ in frequency, DC when inputs 186, 188 are equal in frequency, and approximately zero volts when the inputs 186, 188 are equal in frequency and phase) is inputted to the loop switch 176. During a period when the PLL 114b is not being modulated, the switch 176 is closed and passes this signal 190 directly to the loop filter 178. The filtered output signal 194 is used as the control, or carrier tuning, signal for the VCO 180. The RF output signal 130 of the VCO 180 is fed back to the loop prescaler 182 to produce the prescaled output signal 188 for the mixer 174.

During modulation of the PLL 114b, one bit of the PLL program signal 30e is used to open the loop switch 176, thereby opening the carrier tuning loop. During this time, the output impedance of the loop switch 176 is high (as is the tuning input impedance of the VCO 180). This results in virtually no discharging of the shunt capacitance elements within the lowpass loop filter 178, thereby causing the DC voltage present at the input 192 to the loop filter 178, and therefore the DC carrier tuning voltage at the output 194 of the loop filter 178, to stay virtually constant during the period of direct modulation of the VCO 180. Accordingly, the carrier frequency of the VCO output signal 130 varies little, i.e. it stays substantially frequency- and phase-locked to the prescaled reference signal 186. The transmit signal 24a is fed to a second tuning input of the VCO 180 to directly modulate the oscillator.

As discussed above, the transmit signal 24a consists of short bursts of data. Accordingly, the loop switch 176 needs to be open only for brief periods of time. However, the loop only needs to be "closed" as of a point in time which is sufficiently prior to the time when a frequency-/phase-locked carrier signal is needed. Thus, in accordance with the present invention, the loop is normally kept "open" most of the time, either by turning off the PLL (FIG. 8A) or opening the loop switch 176 (FIG. 8B).

Figure 9:
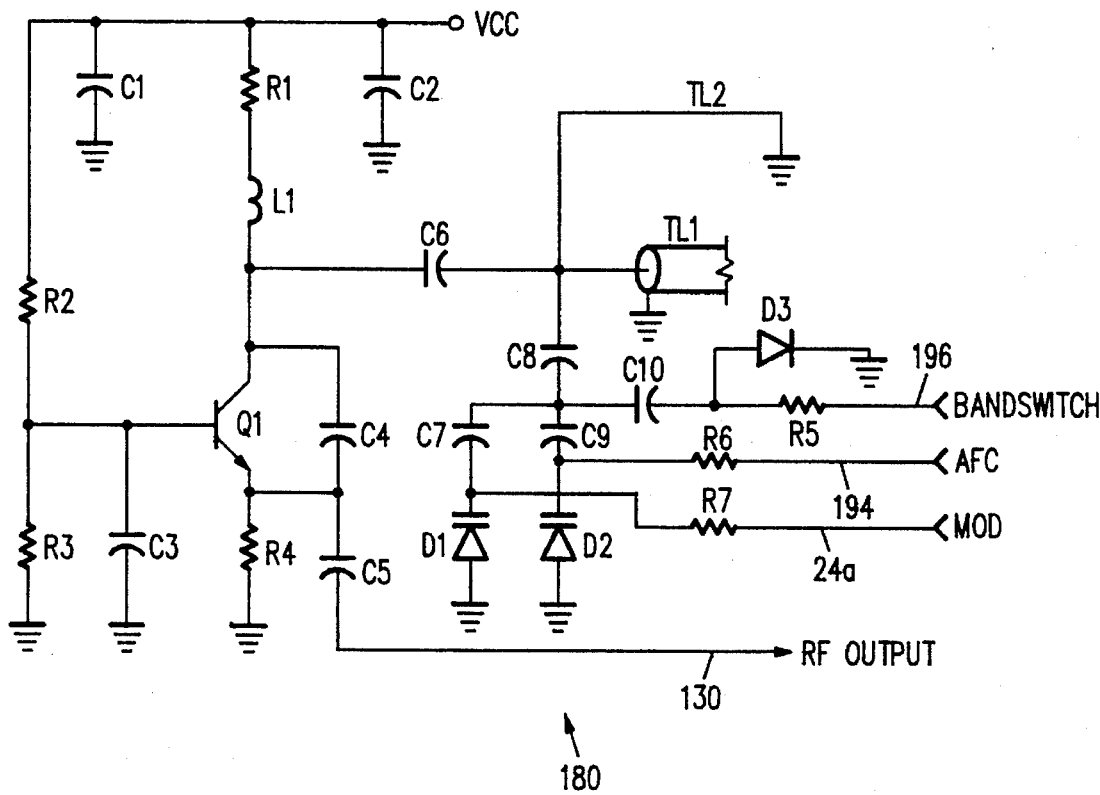
FIG. 9 is a schematic diagram of the voltage-controlled oscillator of the PLL of FIG. 8B.

Referring to FIG. 9, a preferred embodiment of the VCO 180 of FIG. 8B is constructed as shown. (The band switch input 196 can be used to cause the VCO 180 to tune within two separate, discrete frequency bands by inputting an appropriate DC voltage.) The components for this VCO 180 are as shown below in Table 2.

TABLE 2

(FIG. 9)
VCC = 3 volts dc

| Component | Mfr., value/Type |
|---|---|
| Q1 | Bipolarics, B12V105 (bipolar, NPN) |
| D1, D2 | Alpha, SMV1204-14 (varactor) |
| D3 | Mpulse, MP5X4123 (PIN) |
| R1, R4 | 100 ohms (Ω) |
| R2, R3 | 8.2 kilohms (KΩ) |
| R5, R6, R7 | 10 KΩ |
| C1 | 220 pF |
| C2 | 0.1 microfarad (μF) |
| C3, C4, C5, C6, C7, C9, C10 | 1 pF |
| C8 | 2 pF |
| L1 | 100 nH |
| TL1 | λ/4 shorted stub, quarter wavelength (at 2.4 GHz) shorted coaxial transmission line |
| TL2 | High impedance (inductive) microstrip of selectable length (approximately two inches) |

From the foregoing, it can be seen that, with respect to its reception of its carrier tuning 191 and modulation 24a signals, the summer 179 and VCO 81 combination of FIG. 8A provides the same functionality as the dual tuning input VCO 180 of FIG. 8B which receives its carrier tuning 194 and modulation 24a signals more directly. Accordingly, the summer 179 and VCO 181 combination of FIG. 8A can be considered functionally as an alternative form of a dual tuning input VCO, albeit one which has its frequency tuned with a composite tuning input signal (carrier plus modulation) rather than one which is tuned directly by each of its individual tuning input signals (carrier and modulation).

Figure 10:
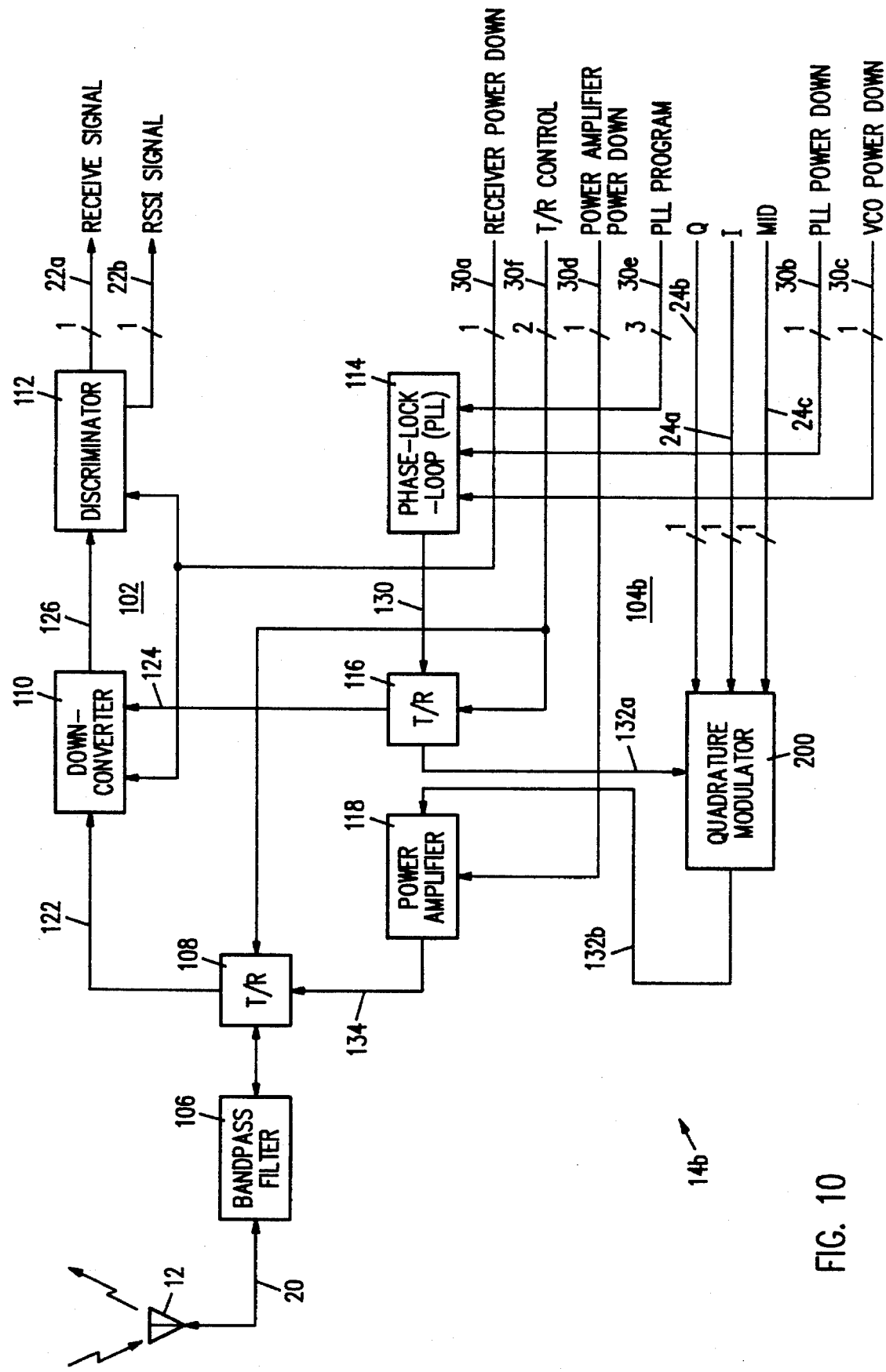
FIG. 10 is a block diagram of an alternative embodiment of a transceiver in accordance with the present invention.

Referring to FIG. 10, an alternative embodiment of a transceiver 14b in accordance with the present invention includes the receiver 102, bandpass filter 106 and antenna signal router 108, as discussed above for the embodiment 14a of FIG. 3. However, the transmitter 104b differs in that quadrature modulation is used. The operation of the receiver 102, bandpass filter 106 and antenna signal router 108 is the same as that discussed above for FIG. 3.

The PLL 114 is not modulated directly during signal transmission. Instead, the RF output (unmodulated) 130 of the PLL 114, via the transmit signal router 116, is routed to a quadrature modulator 200. Using quadrature input signals 24a, 24b (and a mid-range DC reference signal 24c as discussed further below), the quadrature modulator 200 modulates the RF transmit signal 132a in quadrature. The resulting quadrature-modulated signal 132b is then amplified by the power amplifier 118, and routed out to the antenna 12 for transmission, as discussed above.

Figure 11:
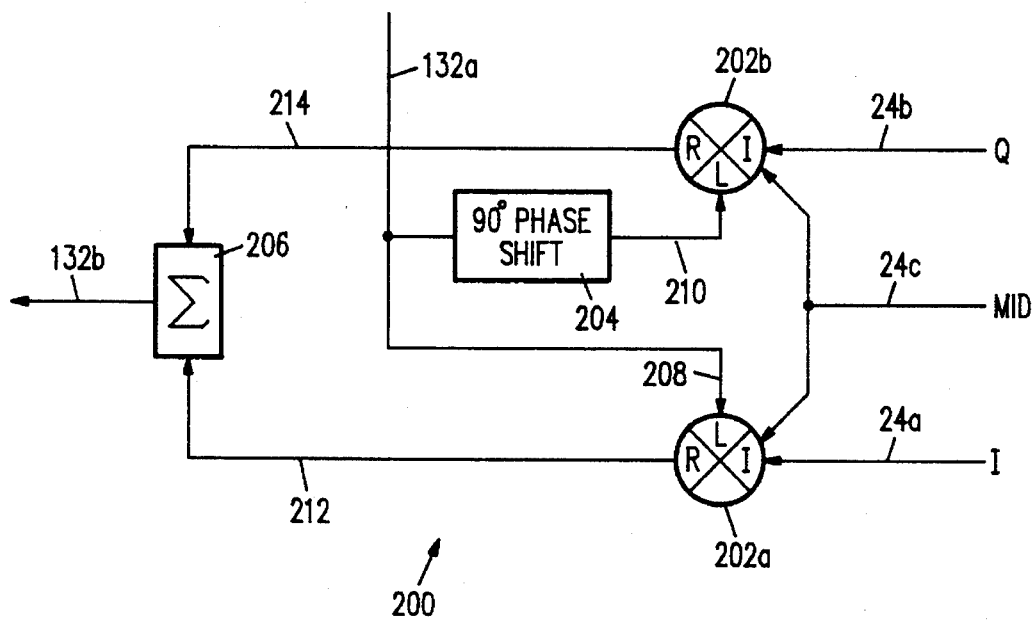
FIG. 11 is a block diagram of the quadrature modulator of the transceiver of FIG. 10.

Referring to FIG. 11, a quadrature modulator 200 used in a transceiver 14b in accordance with the present invention includes two mixers 202a, 202b, a phase shifter 204 and an output signal summer 206, as shown. The transmit carrier signal 132a is used as the LO signal for the two mixers 202a, 202b. The in-phase carrier 208 is mixed with the in-phase ("I") transmit signal 24a. The quadrature carrier signal 210 is mixed with the quadrature ("Q") transmit signal 24b. (The mid-range DC reference signal 24c is used if the mixers 202a, 202b use differential input signals 24a, 24b, 208, 210.) The resulting in-phase 212 and quadrature 214 modulated signals are summed in the signal summer 206 to produce the quadrature-modulated transmit signal 132b.

Figure 12:
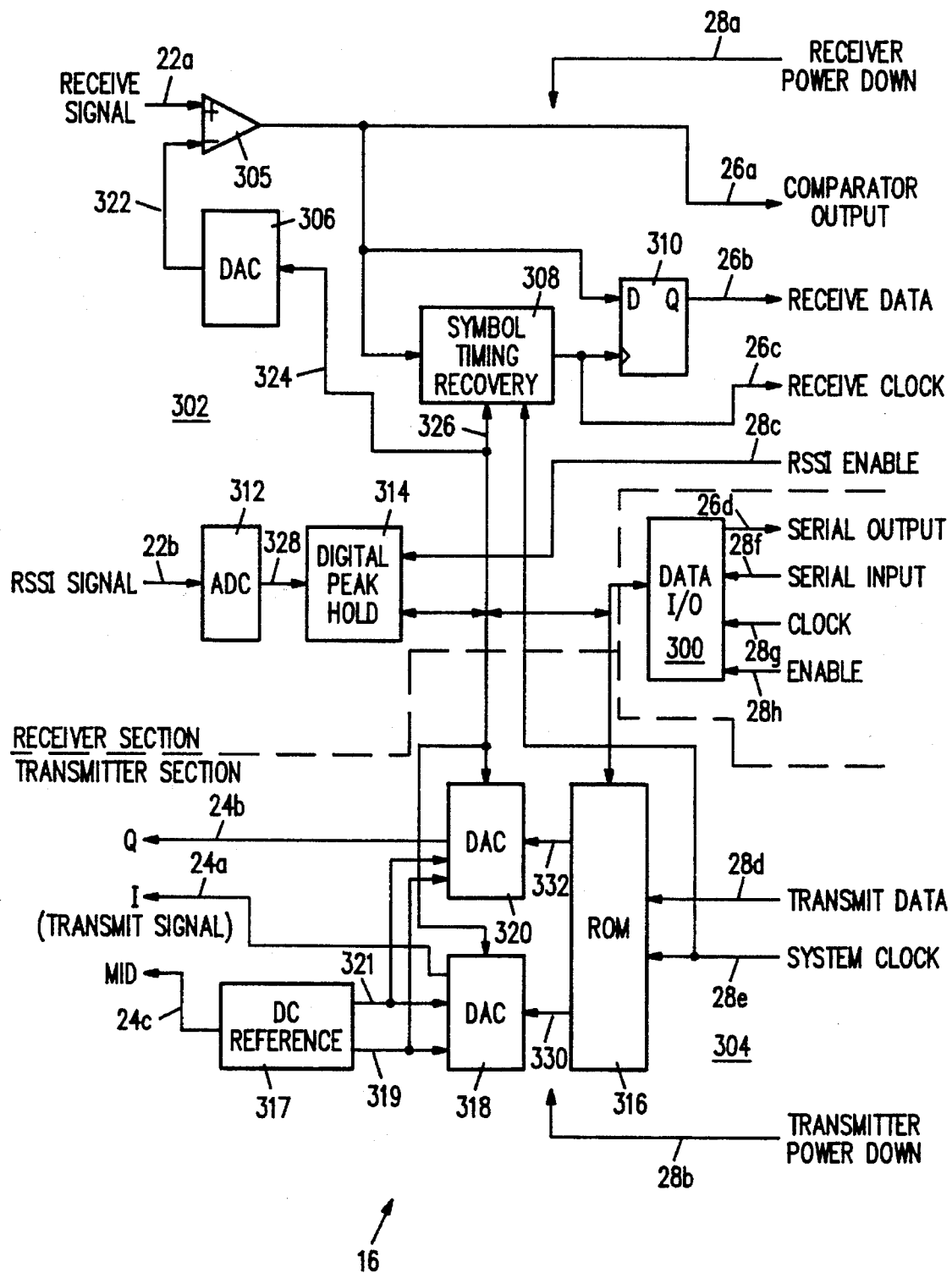
FIG. 12 is a block diagram of the transceiver interface of FIG. 1.

Referring to FIG. 12, the transceiver interface 16 includes a data input/output (I/O) circuit 300, receiver section 302 and transmitter section 304, as shown. The data I/O 300 receives a serial data input signal 28f, a data clock 28g and enable signal 28h, and provides a serial data output signal 26d. It is via these signal lines 26d, 28f, 28g, 28h that input and output data and commands are routed between the host controller 18 and the receiver 302 and transmitter 304 sections of the transceiver interface 16.

The receiver section 302 includes a voltage comparator 305, digital-to-analog converter (DAC) 306, symbol timing recovery ("STR") circuit 308, D-type flip-flop 310, analog-to-digital converter (ADC) 312 and digital peak hold circuit 314, as shown. The transmitter section 304 includes a read-only memory (ROM) 316, two DACs 318, 320 and a DC reference generator 317, as shown. The active elements within the receiver section 302 can be selectively powered down by a receiver power down signal 28a from the host controller 18, as can the active elements within the transmitter section 304 by a transmitter power down signal 28b.

In the receiver section 302, the receive signal 22a from the discriminator 112 of the transceiver 14 is received by the voltage comparator 305, and compared against an analog threshold voltage 322 provided by the DAC 306. This produces a binary comparator output signal 26a. This binary signal 26a is fed to the D-input of the flip-flop 310 and to the STR circuit 308. As discussed further below, the STR circuit 308 recovers the receive data clock 26c associated with the incoming data, and uses it via the flip-flop 310 to sample the binary comparator output signal 26a. This results in recovery of the receive data 26b and receive data clock 26c. As discussed further below, the binary comparator output 26a is used to adjust the analog threshold voltage 322 outputted by the DAC 306 (i.e. in accordance with the digital input signal 324 to the DAC 306).

The RSSI signal 22b (also from the discriminator 112 of the transceiver 14) is converted to a digital signal 328 by the ADC 312. The digital peak hold circuit 314, enabled by an RSSI enable signal 28c (from the host controller 18), holds the peak value of the digital RSSI signal 328 (for use by the host controller 18 via the output 26d of the data I/O 300).

In the transmitter section 304, the transmit data 28d is used to address the ROM 316 (in accordance with the system clock 28e). The ROM 316, whose contents can be programmed by the host controller 18 via the data I/O 300, serves as a look-up table. The data outputs 330, 332, based upon the input addresses 28d, construct pulse responses in accordance with a Gaussian filter shape. These data signals 330, 332 are inputted to the DACs 318, 320, which produce the in-phase ("I") 24a and quadrature ("Q") 24b transmit signals discussed above. The DC reference generator 317 provides lower 319 and upper 321 DC reference voltages for the DACs 318, 320, and the mid-range (e.g. between the lower 319 and upper 321 DC reference voltages) DC reference signal 24c used for quadrature modulation, as discussed above.

Figure 13A:
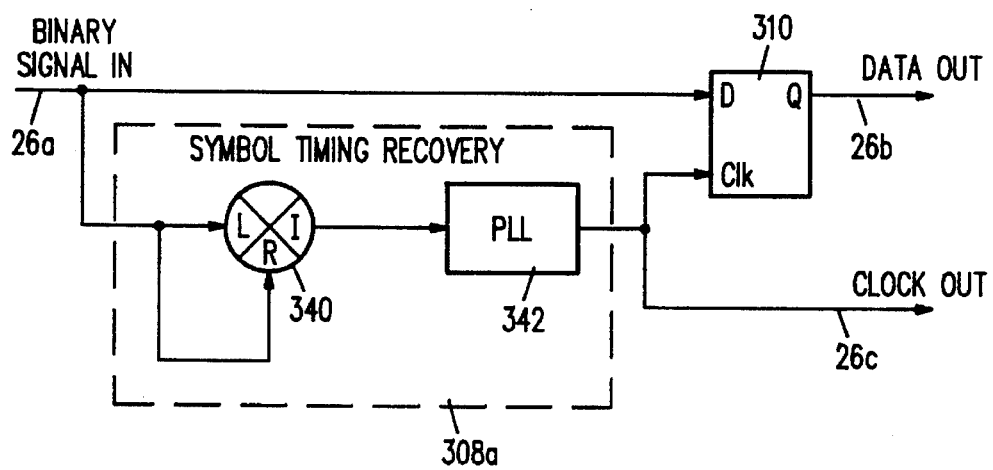
FIG. 13A is a block diagram of the symbol timing recovery circuit of the transceiver interface of FIG. 12.

Referring to FIG. 13A, an STR circuit 308a in accordance with the present invention uses a mixer 340 and PLL 342, as shown. The mixer 340, with the input signal 26a fed to its LO and RF ports, acts as a frequency doubler and produces an IF signal with discrete frequency elements at the bit rate frequency. The PLL 342 filters out random data noise and produces the data clock 26c. In a preferred embodiment, the STR circuit 308a is an all-digital implementation in which an EXCLUSIVE-OR gate multiplier is used for the mixer 340 and an all-digital PLL (e.g. with a numerically-controlled oscillator, digital phase comparator and digital loop filter) is used for the PLL 342.

Figure 13B:
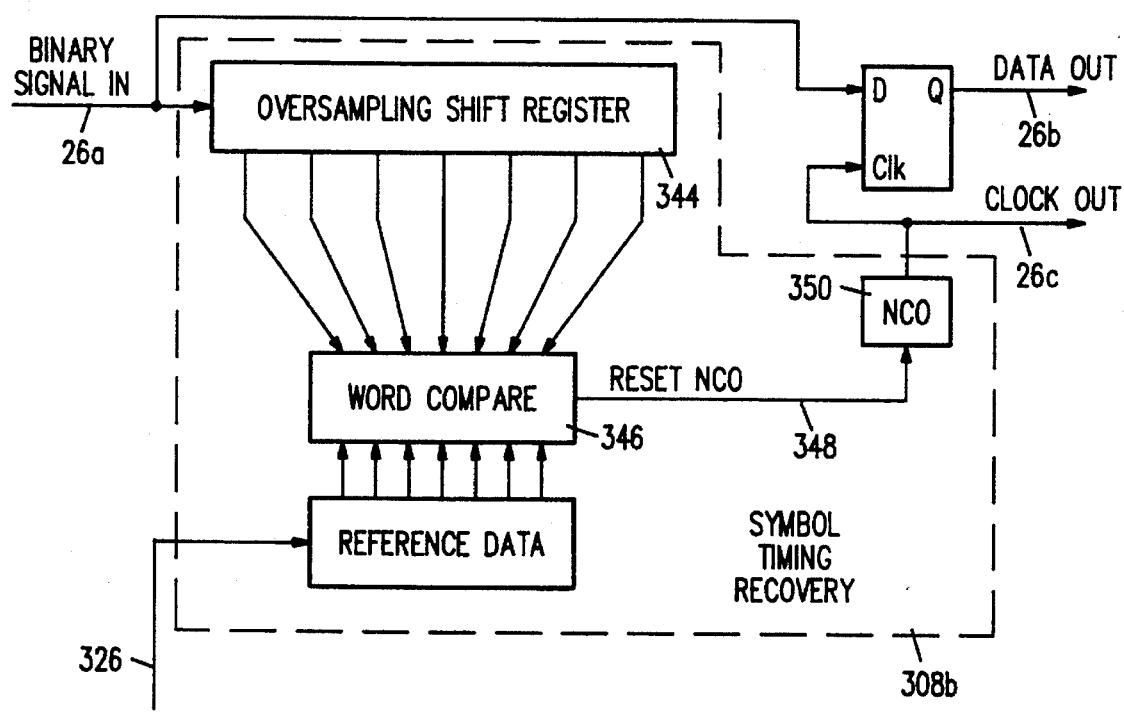
FIG. 13B is a block diagram of an alternative symbol timing recovery circuit for the transceiver interface of FIG. 12.

Referring to FIG. 13B, an alternative embodiment of an STR circuit 308b in accordance with the present invention uses a correlator. When instructed to begin searching for a known data sequence (e.g. the preamble or a predetermined bit sequence of the incoming receive data stream), the shift register 344 begins oversampling the incoming data 26a. As soon as the incoming data within the shift register 344 matches the reference data 326, the comparator 346 outputs a reset signal 348 to reset the free running clock generator 350 (e.g. a numerically-controlled oscillator), thereby providing the recovered data clock 26c.

Figure 14A:
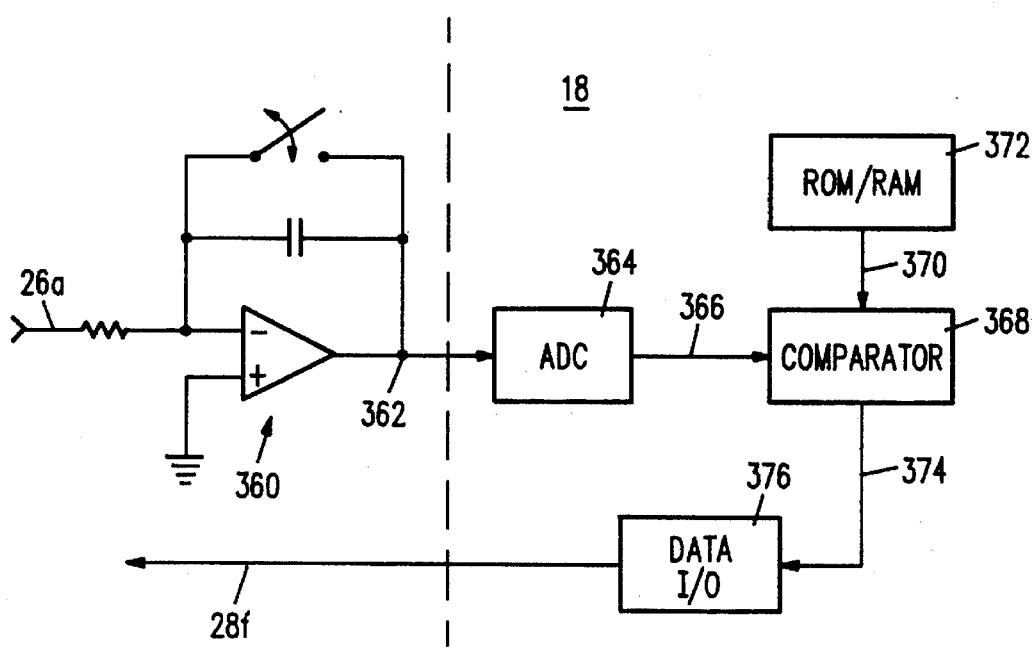
FIGS. 14A and 14B are block diagrams of exemplary duty cycle monitoring circuits for use with the transceiver interface of FIG. 12.

Referring to FIG. 14A, the self-adjustment of the analog threshold signal 322 for the voltage comparator 305 can be better understood. In one embodiment, the binary comparator output 26a is inputted to an integrator circuit 360. The integrated output 362 (reset to zero between receive data bursts with a reset switch) is converted by an ADC 364 to a digital signal 366 which is compared in a comparator 368 against a reference 370 stored in a memory 372. The result 374, in the form of either the same or a new threshold setting, is sent to a data I/O circuit 376 for communication to the data I/O 300 within the transceiver interface 16 (discussed above).

Figure 14B:
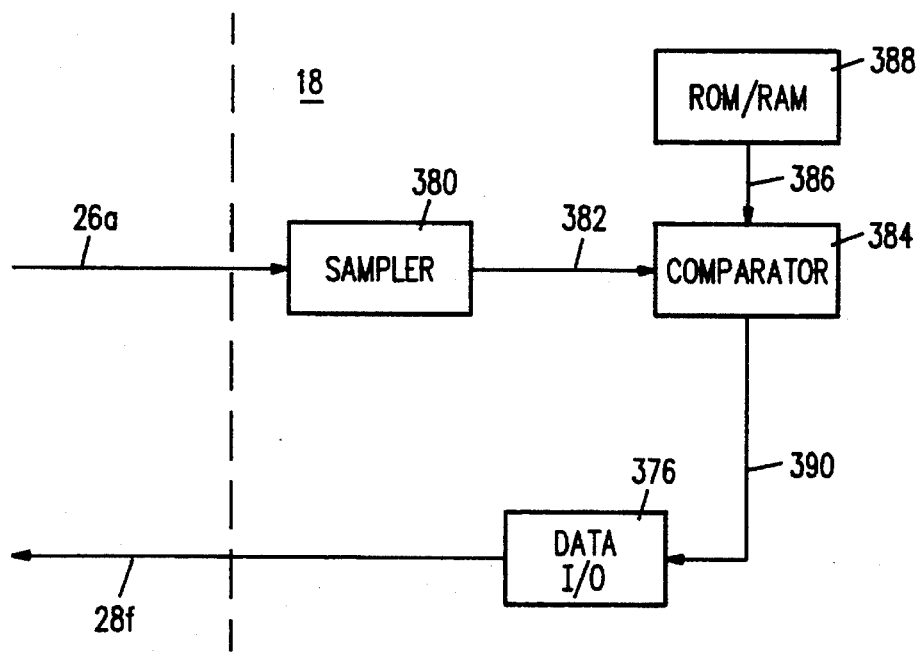

Referring to FIG. 14B, in an alternative embodiment, the binary comparator output 26a is inputted to a sampler 380. The sampled output 382 is compared in a comparator 384 against a reference 386 from a memory 388. The result, in the form of the same or a modified threshold value, is sent to a data I/O circuit 376 for communication to the data I/O 300 of the transceiver interface 16 (discussed above).

The sampler 380 is used to sample the input signal 26a to produce a sampled output signal 382 which consists of a number of logical ones ("1s") and zeros ("0s"). The comparison of this sampled signal 382 with the reference 386 by the comparator 384 is accomplished by counting the number of 1s and 0s within the sampled signal 382 and comparing that count against a reference count of 1s and/or 0s for the reference data 386. If the count is the same, the output 390 of the comparator 384 will be same as before, and the input 324 and output 322 of the DAC 306 within the transceiver interface 16 (FIG. 12) will be unchanged. However, if the count is different, the output 390 of the comparator 384 will reflect that difference, and the input 324 and output 322 of the DAC 306 will be changed accordingly.

Figure 15:
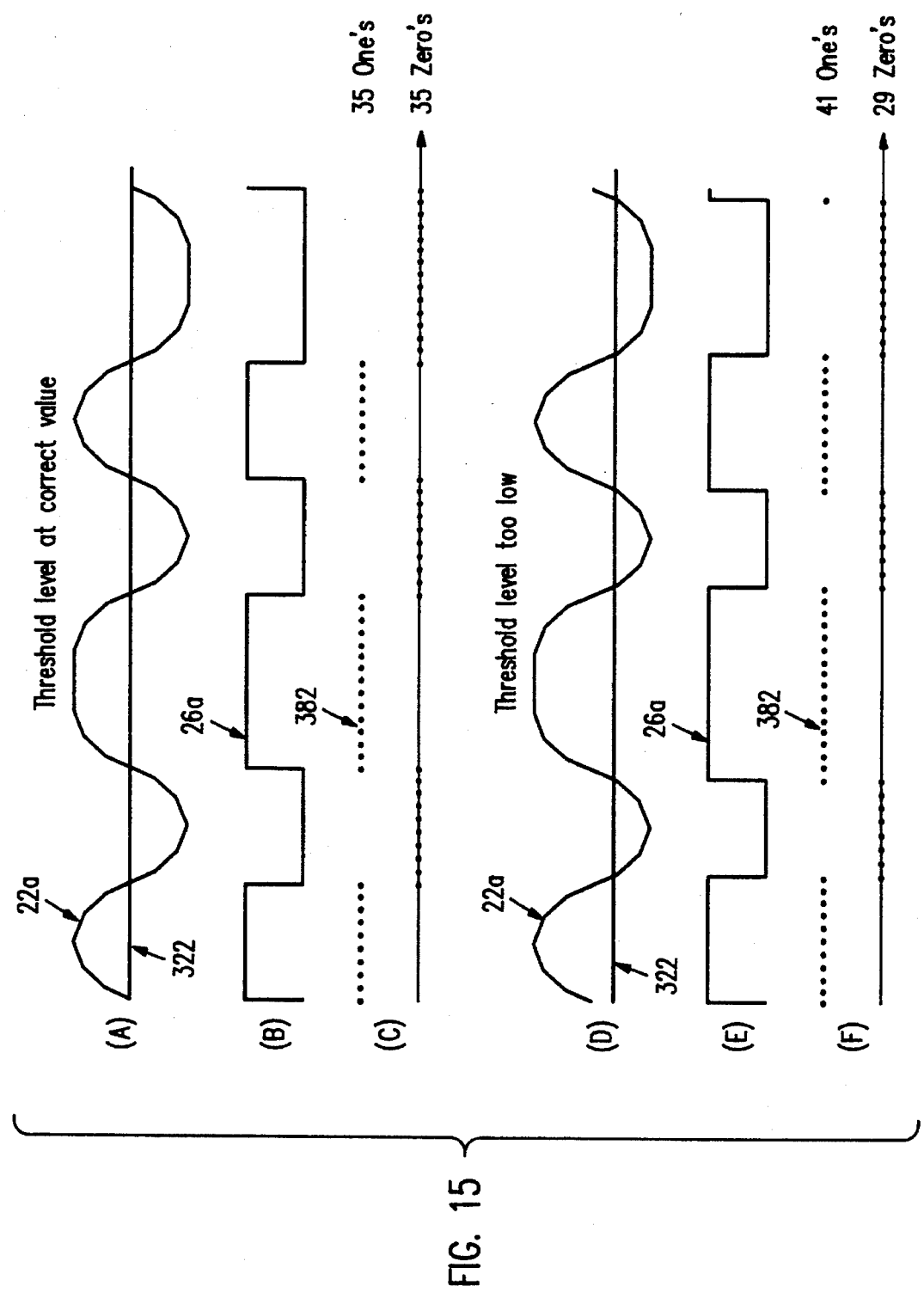
FIG. 15 illustrates exemplary signals and timing relationships for the duty cycle monitoring circuits of FIGS. 14A and 14B.

Referring to FIG. 15, this method of comparing sample counts can be better understood. In FIG. 15A, the threshold 322 is set at the correct value relative to the incoming receive signal 22a. This results in the binary output signal 26a shown in FIG. 15B, which in turn results in the sampled signal 382 shown in FIG. 15C. The "count" of 1s and 0s in this example is equal to the reference 386 stored in the memory 388. Therefore, the output 390 of the comparator 384 will cause the input 324 and output 322 of the DAC 306 to remain unchanged.

However, as shown in FIG. 15D, when the threshold 322 is too low relative to the incoming receive signal 22a, the resulting binary output signal 26a, as shown in FIG. 15E, has an improper duty cycle. This will be seen when comparing the sampled output 382, shown in FIG. 15F, with the reference 386. Accordingly, the output 390 from the comparator 384 will cause the input 324, and therefore the output 322, of the DAC 306 to change, thereby causing the foregoing signals to appear as shown in FIGS. 15A through 15C.

Figure 16:
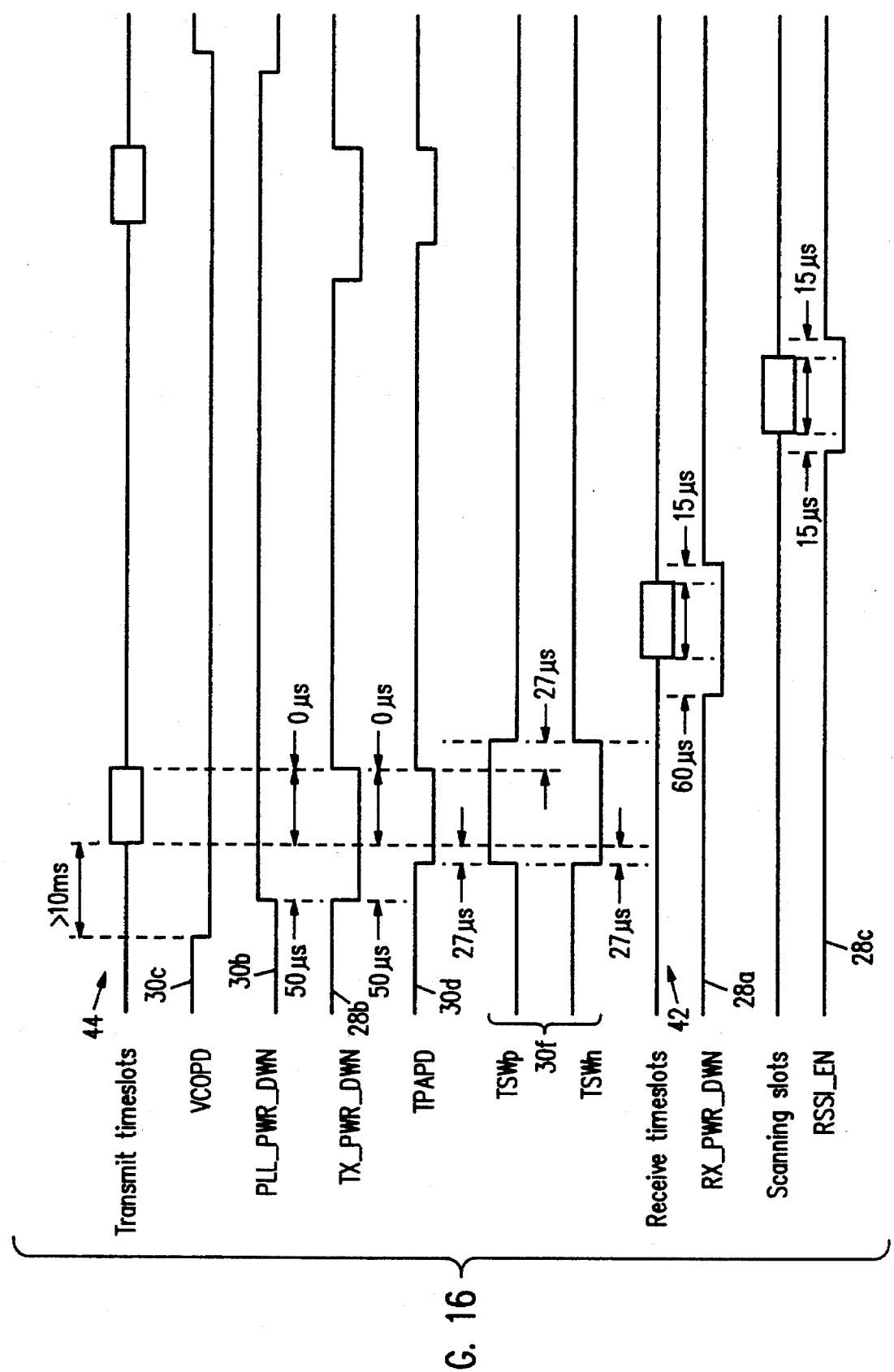
FIG. 16 illustrates exemplary signal timing relationships for the various data and control signals used in an RF telecommunications transceiver in accordance with the present invention.

Referring to FIG. 16, in a preferred embodiment of the present invention, the above-discussed control signals 28a, 28b, 28c, 30b, 30c, 30d, 30f are preferably aligned in time, relative to the reception of the receive data time slots 42 and transmission of the transmit data time slots 44, as shown. By aligning the signals in this manner, a number of advantages are realized, including minimum power consumption while meeting the DECT systems standards.

By examining FIG. 16, it can be seen that a typical sequence for the above-discussed signals for a telephone conversation would be as shown below in Table 3.

TABLE 3

(1) Tune PLL 114 in transmitter 104a of transceiver 14 to desired transmit signal 130 frequency via PLL program signal 30e;
(2) Turn on transmitter section 304 of transceiver interface 16 via transmitter power down signal 28b;
(3) Set T/R control signal 30f for "transmit" operation;
(4) After PLL 114 settles (in phase), open PLL loop switch 176 via PLL program signal 30e;
(5) Turn on power amplifier 118 in transmitter 104a of transceiver 14 via power amplifier power down signal 30d;
(6) Transmit data (e.g. modulate VCO 180 in PLL 114 with transmit data 24a, etc.);
(7) Turn off power amplifier 118 via power amplifier power down signal 30d;
(8) Turn off transmitter section 304 via transmitter power down signal 28b;
(9) Set T/R control signal 30f for "receive" operation;
(10) Tune PLL 114 to desired receiver LO signal 124 frequency via PLL program signal 30e;
(11) Turn on receiver 102 of transceiver 14 and receiver section 302 of transceiver interface 16 via receiver power down signals 30a and 28a, respectively;
(12) Receive, down-convert, demodulate and recover data;
(13) Turn off receiver 102 and receiver section 302 via receiver power down signals 30a and 28a, respectively;
(14) Repeat steps (1) through (13) to monitor a second channel.

Further information about a set of electronic components in the form of integrated circuits, which together form an RF telecommunications transceiver in accordance with the present invention, can be found in the application notes and preliminary data sheets attached hereto as Addendum A. The material in Addendum A is incorporated herein by reference.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments. It is intended that the following claims define the scope of the present invention, and that structures and methods within the scope of these claims and their equivalence be covered thereby.

What is claimed is:

1. A radio frequency (RF) transceiver in which transmit and receive operations are selectively time-division-duplexed, comprising:

signal generator means for receiving a plurality of control signals and in accordance therewith generating a transmitter RF signal during a first time period and a receiver RF signal during a second time period, wherein said first and second time periods are mutually exclusive;

transmitter means coupled to said signal generator means for receiving said transmitter RF signal, a transmit enable signal and a modulation signal and in accordance therewith modulating said transmitter RF signal to provide a first modulated RF signal during a third time period, wherein operation of said transmitter means is enabled during said third time period and disabled otherwise;

receiver means coupled to said signal generator means for receiving a receive enable signal and said receiver RF signal and in accordance therewith receiving, down-converting and demodulating a second modulated RF signal to provide a demodulated signal during a fourth time period, wherein operation of said receiver means is enabled during said fourth time period and disabled otherwise;

transmitter interface means coupled to said transmitter means for receiving a transmit data signal and in accordance therewith providing said modulation signal during said third time period; and receiver interface means coupled to said receiver means for receiving said demodulated signal and in accordance therewith providing a receive data signal during said fourth time period.

2. An RF transceiver as recited in claim 1, wherein said signal generator means comprises an RF signal generator for generating a local RF signal and further comprises a local RF switch coupled to said RF signal generator, said transmitter means and said receiver means for receiving and outputting said local RF signal as said transmitter RF signal during said first time period and as said receiver RF signal during said second time period, and wherein said plurality of control signals includes a local switch control signal for said local RF switch.

3. An RF transceiver as recited in claim 1, wherein said signal generator means comprises a phase-lock-loop (PLL) which includes a voltage-controlled oscillator (VCO) and a programmable frequency divider, and wherein said plurality of control signals includes a frequency data signal and a data clock signal.

4. An RF transceiver as recited in claim 3, wherein said PLL further includes a phase detector for controlling said VCO, and said plurality of control signals further includes a power down signal for turning off said phase detector.

5. An RF transceiver as recited in claim 3, wherein said PLL further includes a loop switch for opening said PLL during said third time period, and said plurality of control signals further includes a loop switch control signal for said loop switch.

6. An RF transceiver as recited in claim 1, wherein said transmitter means comprises a modulation input port of a phase-lock-loop for receiving said modulation signal and in accordance therewith modulating said transmitter RF signal to provide said first modulated RF signal.

7. An RF transceiver as recited in claim 1, wherein said receiver means comprises a mixer for receiving and down-converting said second modulated RF signal with said receiver RF signal to provide a modulated intermediate frequency (IF) signal.

8. An RF transceiver as recited in claim 7, wherein said receiver means further comprises a frequency demodulator coupled to said mixer for receiving and frequency demodulating said modulated IF signal to provide said demodulated signal.

9. An RF transceiver as recited in claim 1, wherein said transmitter interface means comprises a digital-to-analog converter for receiving said transmit data signal and in accordance therewith providing said modulation signal.

10. An RF transceiver as recited in claim 1, wherein said transmitter interface means comprises a digital filter for receiving and filtering said transmit data signal to provide said modulation signal.

11. An RF transceiver as recited in claim 10, wherein said digital filter comprises a look-up table for receiving said transmit data signal as an address input signal and providing said modulation signal as a data output signal.

12. An RF transceiver as recited in claim 1, wherein said receiver interface means comprises a comparator for receiving and comparing said demodulated signal with a threshold signal to provide said receive data signal.

13. An RF transceiver as recited in claim 1, further comprising an antenna switch coupled to said transmitter means and said receiver means for receiving an antenna switch control signal and in accordance therewith receiving and switching said first modulated RF signal to an antenna during said first time period and receiving and switching said second modulated RF signal from said antenna during said second time period.

14. A radio frequency (RF) transceiver in which transmit and receive operations are selectively time-division-duplexed, comprising:

a signal generator which receives a plurality of control signals and in accordance therewith generates a transmitter RF signal during a first time period and a receiver RF signal during a second time period, wherein said first and second time periods are mutually exclusive;

a transmitter, coupled to said signal generator, which receives said transmitter RF signal, a transmit enable signal and a modulation signal and in accordance therewith modulates said transmitter RF signal to provide a first modulated RF signal during a third time period, wherein operation of said transmitter is enabled during said third time period and disabled otherwise;

a receiver, coupled to said signal generator, which receives a receive enable signal and said receiver RF signal and in accordance therewith receives, down-converts and demodulates a second modulated RF signal to provide a demodulated signal during a fourth time period, wherein operation of said receiver is enabled during said fourth time period and disabled otherwise;

a transmitter interface, coupled to said transmitter, which receives a transmit data signal and in accordance therewith provides said modulation signal during said third time period; and a receiver interface, coupled to said receiver, which receives said demodulated signal and in accordance therewith provides a receive data signal during said fourth time period.

15. An RF transceiver as recited in claim 14, wherein said signal generator comprises an RF signal generator which generates a local RF signal and further comprises a local RF switch, coupled to said RF signal generator, said transmitter and said receiver, which receives and outputs said local RF signal as said transmitter RF signal during said first time period and as said receiver RF signal during said second time period, and wherein said plurality of control signals includes a local switch control signal for said local RF switch.

16. An RF transceiver as recited in claim 14, wherein said signal generator comprises a phase-lock-loop (PLL) which includes a voltage-controlled oscillator (VCO) and a programmable frequency divider, and wherein said plurality of control signals includes a frequency data signal and a data clock signal.

17. An RF transceiver as recited in claim 16, wherein said PLL further includes a phase detector for controlling said VCO, and said plurality of control signals further includes a power down signal for turning off said phase detector.

18. An RF transceiver as recited in claim 16, wherein said phase-lock-loop further includes a loop switch which opens said phase-lock-loop during said third time period, and said plurality of control signals further includes a loop switch control signal for said loop switch.

19. An RF transceiver as recited in claim 14, wherein said transmitter comprises a modulation input port of a phase-lock-loop which receives said modulation signal and in accordance therewith modulates said transmitter RF signal to provide said first modulated RF signal.

20. An RF transceiver as recited in claim 14, wherein said receiver comprises a mixer which receives and down-converts said second modulated RF signal with said receiver RF signal to provide a modulated intermediate frequency (IF) signal.

21. An RF transceiver as recited in claim 20, wherein said receiver further comprises a frequency demodulator, coupled to said mixer, which receives and frequency demodulates said modulated IF signal to provide said demodulated signal.

22. An RF transceiver as recited in claim 14, wherein said transmitter interface comprises a digital-to-analog converter which receives said transmit data signal and in accordance therewith provides said modulation signal.

23. An RF transceiver as recited in claim 14, wherein said transmitter interface comprises a digital filter which receives and filters said transmit data signal to provide said modulation signal.

24. An RF transceiver as recited in claim 23, wherein said digital filter comprises a look-up table which receives said transmit data signal as an address input signal and provides said modulation signal as a data output signal.

25. An RF transceiver as recited in claim 14, wherein said receiver interface means comprises a comparator which receives and compares said demodulated signal with a threshold signal to provide said receive data signal.

26. An RF transceiver as recited in claim 14, further comprising an antenna switch, coupled to said transmitter and said receiver, which receives an antenna switch control signal and in accordance therewith receives and switches said first modulated RF signal to an antenna during said first time period and receives and switches said second modulated RF signal from said antenna during said second time period.

27. A radio frequency (RF) transceiver controller, comprising:
    a controller which is programmed to input and output a plurality of signals for time-division-duplexing transmit and receive operations of an RF transceiver according to the steps comprising:
        outputting transmit frequency data for tuning a phase-lock-loop (PLL) to provide a transmit RF signal;
        outputting a transmit enable signal for enabling an RF transmitter during a first time period and disabling said RF transmitter otherwise;
        outputting transmit data for use by said RF transmitter for modulating said transmit RF signal to provide a first modulated RF signal during a third time period;
        outputting receive frequency data for tuning said phase-lock-loop (PLL) to provide a receive RF signal;
        outputting a receive enable signal for enabling an RF receiver during a second time period to receive said receive RF signal and to receive and demodulate a second modulated RF signal containing receive data during a fourth time period and disabling said RF receiver otherwise, wherein said first and second time periods are mutually exclusive; and
        inputting said receive data.

28. An RF transceiver controller as recited in claim 27, further comprising the step of outputting a PLL switch control signal for controlling a switch coupled to said PLL for selectively switching an output of said PLL for use as said transmit RF signal and as said receive RF signal.

29. An RF transceiver controller as recited in claim 27, further comprising the step of outputting a power down signal for turning off a portion of said PLL during said third time period.

30. An RF transceiver controller as recited in claim 27, further comprising the step of outputting a loop switch control signal for controlling a loop switch coupled within said PLL for selectively opening said phase-lock-loop during said modulation of said transmit RF signal to provide said first modulated RF signal.

31. An RF transceiver controller as recited in claim 27, further comprising the step of outputting filter data to program a digital filter for filtering said transmit data.

32. An RF transceiver controller as recited in claim 27, further comprising the step of outputting an antenna switch control signal to control an antenna switch for selectively switching said first modulated RF signal to an antenna and switching said second modulated RF signal said from said antenna.

33. A transceiver control method for selectively time-division-duplexing transmit and receive operations of a radio frequency (RF) transceiver, comprising the steps of:
    receiving a plurality of control signals and in accordance therewith generating a transmitter RF signal during a first time period and a receiver RF signal during a second time period, wherein said first and second time periods are mutually exclusive;
    receiving a transmit enable signal;
    receiving a modulation signal;
    modulating said transmitter RF signal in accordance with said transmit enable signal and said modulation signal to provide a first modulated RF signal during a third time period, wherein said modulating of said transmitter RF signal is enabled during said third time period and disabled otherwise;
    receiving a receive enable signal;
    receiving said receiver RF signal;
    receiving, down-converting and demodulating a second modulated RF signal in accordance with said receive enable signal and said receiver RF signal to provide a demodulated signal during a fourth time period, wherein said receiving, down-converting and demodulating of said second modulated RF signal is enabled during said fourth time period and disabled otherwise;
    receiving a transmit data signal and in accordance therewith providing said modulation signal during said third time period; and
    receiving said demodulated signal and in accordance therewith providing a receive data signal during said fourth time period.

34. A transceiver control method as recited in claim 33, wherein said step of receiving a plurality of control signals and in accordance therewith generating a transmitter RF signal during a first time period and a receiver RF signal during a second time period comprises generating a local RF signal, and receiving a local switch control signal and in accordance therewith outputting said local RF signal as said transmitter RF signal during said first time period and as said receiver RF signal during said second time period.

35. A transceiver control method as recited in claim 33, wherein said step of receiving a plurality of control signals and in accordance therewith generating a transmitter RF signal during a first time period and a receiver RF signal during a second time period comprises receiving a frequency data signal and a data clock signal with a programmable frequency divider and in accordance therewith generating said transmitter RF signal and said receiver RF signal with a voltage-controlled oscillator in a phase-lock-loop (PLL).

36. A transceiver control method as recited in claim 35, wherein said step of modulating said transmitter RF signal in accordance with said transmit enable signal and said modulation signal to provide a first modulated RF signal during a third time period comprises turning off a portion of said PLL.

37. A transceiver control method as recited in claim 35, wherein said step of modulating said transmitter RF signal in accordance with said transmit enable signal and said modulation signal to provide a first modulated RF signal during a third time period comprises receiving a loop switch control signal and in accordance therewith opening said phase-lock-loop during said third time period.

38. A transceiver control method as recited in claim 33, wherein said step of modulating said transmitter RF signal in accordance with said transmit enable signal and said modulation signal to provide a first modulated RF signal during said third time period comprises receiving said modulation signal via a modulation input port of a phase-lock-loop and in accordance therewith modulating said transmitter RF signal to provide said first modulated RF signal.

39. A transceiver control method as recited in claim 33, wherein said step of receiving, down-converting and demodulating a second modulated RF signal in accordance with said receive enable signal and said receiver RF signal to provide a demodulated signal during a fourth time period comprises receiving and mixing said second modulated RF signal with said receiver RF signal to provide a modulated intermediate frequency (IF) signal.

40. A transceiver control method as recited in claim 39, wherein said step of receiving, down-converting and demodulating a second modulated RF signal in accordance with said receive enable signal and said receiver RF signal to provide a demodulated signal during a fourth time period further comprises frequency demodulating said modulated IF signal to provide said demodulated signal.

41. A transceiver control method as recited in claim 33, wherein said step of receiving a transmit data signal and in accordance therewith providing said modulation signal during said third time period comprises receiving and converting a digital transmit data signal to an analog modulation signal.

42. A transceiver control method as recited in claim 33, wherein said step of receiving a transmit data signal and in accordance therewith providing said modulation signal during said third time period comprises receiving and digitally filtering said transmit data signal to provide said modulation signal.

43. A transceiver control method as recited in claim 42, wherein said step of digitally filtering said transmit data signal to provide said modulation signal comprises receiving said transmit data signal as an address input signal and providing said modulation signal as a data output signal with a look-up table.

44. A transceiver control method as recited in claim 33, wherein said step of receiving said demodulated signal and in accordance therewith providing a receive data signal during said fourth time period comprises receiving and comparing said demodulated signal with a threshold signal to provide said receive data signal.

45. A transceiver control method as recited in claim 33, further comprising the step of receiving an antenna switch control signal and in accordance therewith switching said first modulated RF signal to an antenna during said first time period and switching said second modulated RF signal from said antenna during said second time period.

46. A radio frequency (RF) transceiver in which transmit and receive operations are selectively time-division-duplexed, comprising:

signal generator means for receiving a plurality of control signals and in accordance therewith generating a transmitter RF signal during a first time period and a receiver RF signal during a second time period;

transmitter means coupled to said signal generator means for receiving said transmitter RF signal, a transmit enable signal and a modulation signal and in accordance therewith modulating said transmitter RF signal to provide a first modulated RF signal during a third time period;

receiver means coupled to said signal generator means for receiving a receive enable signal and said receiver RF signal and in accordance therewith receiving, down-converting and demodulating a second modulated RF signal to provide a demodulated signal during a fourth time period;

transmitter interface means coupled to said transmitter means for receiving a transmit data signal and in accordance therewith providing said modulation signal during said third time period, wherein said transmitter interface means comprises a digital filter for receiving and filtering said transmit data signal to provide said modulation signal, and wherein said digital filter comprises a look-up table for receiving said transmit data signal as an address input signal and providing said modulation signal as a data output signal; and receiver interface means coupled to said receiver means for receiving said demodulated signal and in accordance therewith providing a receive data signal during said fourth time period.

47. A radio frequency (RF) transceiver in which transmit and receive operations are selectively time-division-duplexed, comprising:

a signal generator which receives a plurality of control signals and in accordance therewith generates a transmitter RF signal during a first time period and a receiver RF signal during a second time period;

a transmitter, coupled to said signal generator, which receives said transmitter RF signal, a transmit enable signal and a modulation signal and in accordance therewith modulates said transmitter RF signal to provide a first modulated RF signal during a third time period;

a receiver, coupled to said signal generator, which receives a receive enable signal and said receiver RF signal and in accordance therewith receives, down-converts and demodulates a second modulated RF signal to provide a demodulated signal during a fourth time period;

a transmitter interface, coupled to said transmitter, which receives a transmit data signal and in accordance therewith provides said modulation signal during said third time period, wherein said transmitter interface comprises a digital filter which receives and filters said transmit data signal to provide said modulation signal, and wherein said digital filter comprises a look-up table which receives said transmit data signal as an address input signal and provides said modulation signal as a data output signal; and a receiver interface, coupled to said receiver, which receives said demodulated signal and in accordance therewith provides a receive data signal during said fourth time period.

48. A transceiver control method for selectively time-division-duplexing transmit and receive operations of a radio frequency (RF) transceiver, comprising the steps of:

receiving a plurality of control signals and in accordance therewith generating a transmitter RF signal during a first time period and a receiver RF signal during a second time period;

receiving a transmit enable signal;

receiving a modulation signal;

modulating said transmitter RF signal in accordance with said transmit enable signal and said modulation signal to provide a first modulated RF signal during a third time period;

receiving a receive enable signal;

receiving said receiver RF signal;

receiving, down-converting and demodulating a second modulated RF signal in accordance with said receive enable signal and said receiver RF signal to provide a demodulated signal during a fourth time period;

receiving a transmit data signal and in accordance therewith providing said modulation signal during said third time period by receiving and digitally filtering said transmit data signal to provide said modulation signal by receiving said transmit data signal as an address input signal and providing said modulation signal as a data output signal with a look-up table; and receiving said demodulated signal and in accordance therewith providing a receive data signal during said fourth time period.

\* \* \* \* \*